United States Patent [19]

Demler

[11] Patent Number: 4,539,495

[45] Date of Patent: Sep. 3, 1985

[54] VOLTAGE COMPARATOR

[75] Inventor: Michael J. Demler, Schenectady, N.Y.

[73] Assignee: General Electric Company, Schenectady, N.Y.

[21] Appl. No.: 613,480

[22] Filed: May 24, 1984

[51] Int. Cl.³ .................. H03K 5/24; H03K 3/023
[52] U.S. Cl. ........................... 307/530; 307/246; 307/355; 307/362
[58] Field of Search ........... 307/530, 355, 362, 279, 307/246; 365/205, 207, 208

[56] References Cited

U.S. PATENT DOCUMENTS

| | | | |
|---|---|---|---|
| 4,007,381 | 2/1977 | Mohsen | 307/355 |
| 4,096,402 | 6/1978 | Schroeder et al. | 307/362 |
| 4,149,099 | 4/1979 | Nagami | 307/362 X |
| 4,181,865 | 1/1980 | Kohyama | 307/530 |
| 4,412,143 | 10/1983 | Patella et al. | 307/530 |
| 4,485,317 | 11/1984 | Davies, Jr. | 307/530 X |

*Primary Examiner*—Larry N. Anagnos
*Attorney, Agent, or Firm*—Marvin Snyder; James C. Davis, Jr.

[57] ABSTRACT

The voltage comparator includes a first and a second voltage supply terminal, and a first and a second output node. A first current source is connected between the first supply terminal and the first output node. A first field effect transistor of one channel conductivity type is connected between the first output node and the second supply terminal. The gate of the first transistor is connected to the second output node. A second current source is connected between the first supply terminal and the second output node. A second field effect transistor of the one conductivity is connected between the second output node and the second supply terminal. The gate of the second transistor is connected to the first output node. During a first period of time the first and second output nodes and the capacitances of the gates of the first and second transistors connected thereto are maintained at the potential of the second supply terminal by switches connected thereacross. At the end of the first period the switches are opened allowing the first and second output nodes to charge. Simultaneously charge proportional to a first signal voltage is supplied to the first output node and charge proportional to a second signal voltage is supplied to the second output node. The node which receives the greater charge rapidly charges toward the voltage of the first supply terminal and the node which receives the smaller charge is maintained at the potential of the second supply terminal. Thus, an indication is obtained of the greater of the two voltages.

8 Claims, 6 Drawing Figures

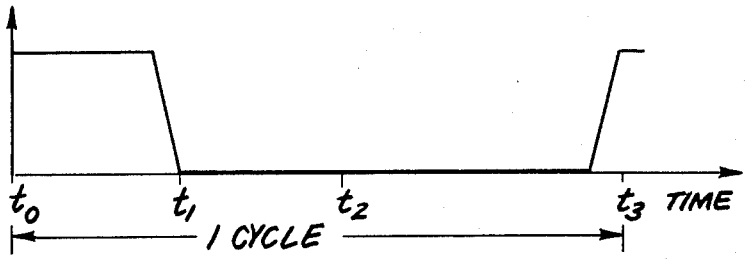
FIG. 2A CLOCK VOLTAGE $\phi_1$
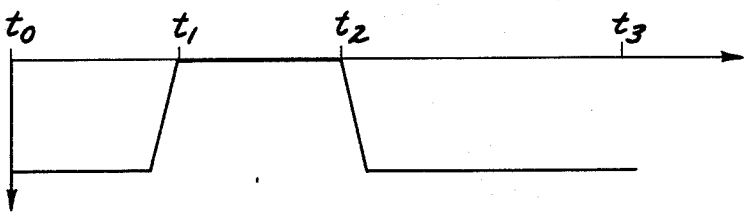
FIG. 2B CLOCK VOLTAGE $\phi_2$
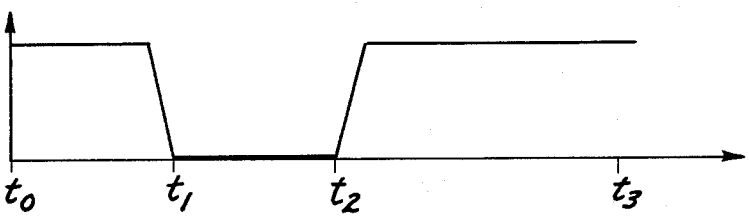
FIG. 2C CLOCK VOLTAGE $\overline{\phi_2}$
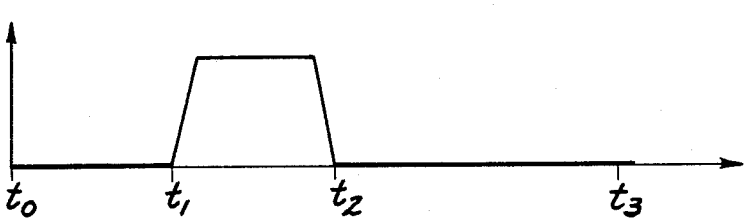
FIG. 2D CLOCK VOLTAGE $\phi_3$
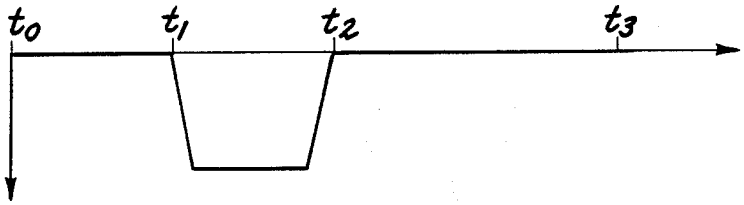
FIG. 2E CLOCK VOLTAGE $\overline{\phi_3}$

VOLTAGE COMPARATOR

The present invention relates in general to voltage comparators and in particular to differential comparators which simultaneously compare a pair of voltages. Voltage comparators are utilized in electronic systems such as analog to digital converters to compare two voltage signals and provide an output of one value when one of the signals is greater than the other and provide an output of another value when the one signal is less than the other signal.

An object of the present invention is to provide a high speed, high sensitivity differential comparator.

Another object of the present invention is to provide a differential comparator which is responsive to input signals extending over the full range of the supply voltage therefor.

Another object of the present invention is to provide a differential comparator which has low offset voltage.

Another object of the present invention is to provide a differential comparator requiring a minimum number of transistors.

In carrying out the invention in one illustrative embodiment thereof, there is provided a first voltage supply terminal, a second voltage supply terminal, a first output node, a second output node, a first current source and a second current source. The first current source is connected between the first voltage supply terminal and the first output node. The second current source is connected between the first voltage supply terminal and the second output node. A first capacitor and a second capacitor of substantially identical capacitance are provided. The first capacitor is connected between the first output node and the second voltage supply terminal. The second capacitor is connected between the second output node and the second voltage supply terminal. A first and a second insulated-gate field-effect transistor of one channel conductivity type and of substantially identical structure are provided. The channel of the first insulated-gate field-effect transistor is connected between the first output node and the second voltage supply terminal. The channel of the second insulated-gate field-effect transistor is connected between the second output node and the second voltage supply terminal. The gate of the first insulated-gate field-effect transistor is connected to the second output node. The gate of the second insulated-gate field-effect transistor is connected to the first output node.

A first unidirectional voltage is applied between the first and second voltage supply terminals. A first switching means is provided for connecting the first output node to the second voltage supply terminal during a first period of time whereby the potential of the first output node is set to substantially the potential of the second voltage supply terminal during the aforementioned first period of time. A second switching means is provided for connecting the second output node to the second voltage supply terminal during the aforementioned first period of time whereby the potential of the second output node is set to substantially the potential of the second voltage supply terminal during the aforementioned first period of time. A third capacitor and a fourth capacitor of substantially identical capacitance are provided. The capacitance of the third capacitor is comparable to the capacitance of the first capacitor.

A first signal voltage is provided. A second signal voltage less than the first signal voltage is also provided. A third switching means is provided for charging the third capacitor to the first signal voltage during the aforementioned first period of time. A fourth switching means is provided for charging the fourth capacitor to the second signal voltage during the aforementioned first period of time. A fifth switching means is provided for connecting the third capacitor in parallel with the first capacitor at the end of the aforementioned first period of time. A sixth switching means is provided for connecting the fourth capacitor in parallel with the second capacitor at the end of the aforementioned first period of time.

Thus, at the end of the first period of time, the first and second capacitors and hence the gates of the first and second transistors are charged through the first and second current sources causing the second transistor to become conductive as the gate thereof has a greater initial voltage appearing thereon than the gate of the first transistor and causing the first transistor to remain nonconductive as the voltage on the second output node is fed back to the gate of the first transistor.

The novel features which are believed to be characteristic of the present invention are set forth with particularity in the appended claims. The invention itself, both as to its organization and method of operation, together with further objects and advantages thereof, may best be understood by reference to the following description taken in connection with the accompanying drawings wherein:

FIG. 2A-2F show the clocking voltages supplied to the various clocking terminals of the differential comparator of FIG. 1 for the operation thereof.

Figure 1:
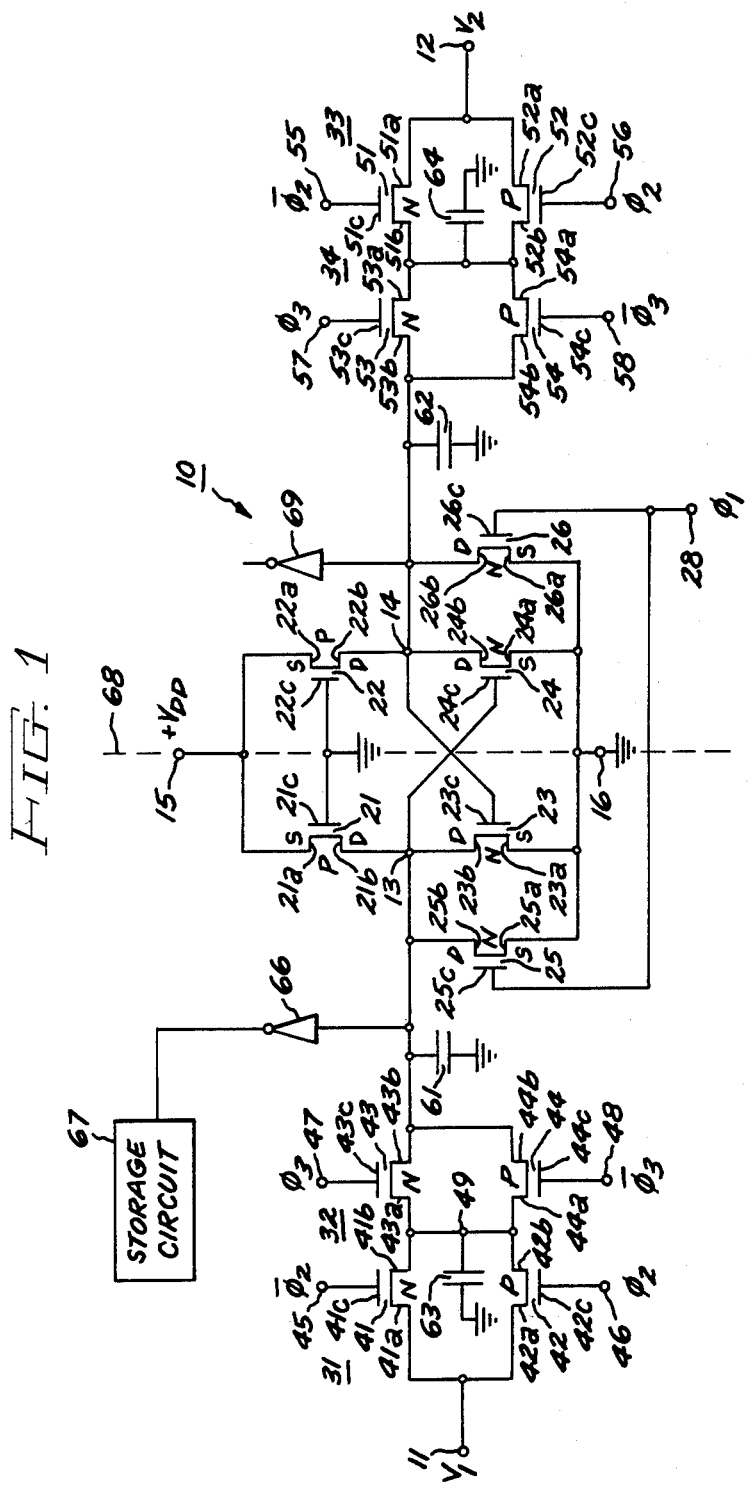
FIG. 1 shows a schematic diagram of a differential comparator in accordance with the present invention.

Reference is now made to the schematic diagram of FIG. 1 which shows a self-latching differential comparator in accordance with the present invention. The comparator 10 includes first and second input terminals 11 and 12, first and second output nodes 13 and 14, and first and second voltage supply terminals 15 and 16. The comparator 10 also includes P-channel insulated gate field-effect transistors 21 and 22 and N-channel insulated-gate field effect transistors 23-26. P-channel transistor 21 has a source 21a, a drain 21b and a gate 21c. P-channel transistor 22 has a source 22a, a drain 22b and a gate 22c. N-channel transistor 23 has a source 23a, a drain 23b and a gate 23c. N-channel transistor 24 has a source 24a, a drain 24b and a gate 24c. N-channel transistor 25 has a source 25a, a drain 25b and a gate 25c. N-channel transistor 26 has a source 26a, a drain 26b and a gate 26c. The sources 21a and 22a of P-channel transistors 21 and 22 are connected to the first voltage supply terminal 15. The drains 21b and 22b of P-channel transistors 21 and 22 are connected to respective output nodes 13 and 14. The drains 23b and 24b of N-channel transistor 23 and N-channel transistor 24 are connected to respective output nodes 13 and 14. The sources 23a and 24a of N-channel transistors 23 and 24 are connected to the second supply terminal 16 which is connected to ground. The gates 21c and 22c of P-channel transistors 21 and 22 are connected to ground. The gate 23c of N-channel transistor 23 is connected to output node 14. The gate 24c of N-channel transistor 24 is connected to output node 13. The drains 25b and 26b of N-channel transistors 25 and 26 are connected to respective output nodes 13 and 14. The sources 25a and 26a of N-channel transistors 25 and 26 are connected to voltage supply terminal 16. The gates 25c and 26c of N-channel transistors 25 and 26 are connected to terminal 28.

The comparator 10 also includes switching circuits 31, 32, 33 and 34. The switching circuit 31 includes N-channel transistor 41 having main electrodes (source and drain) 41a and 41b and a gate 41c and P-channel transistor 42, having main electrodes 42a and 42b and a gate 42c. The switching circuit 32 includes an N-channel transistor 43 having main electrodes 43a and 43b and a gate 43c and a P-channel transistor 44 having main electrodes 44a and 44b and a gate 44c. The electrodes 41a and 42a are connected to input terminal 11. Electrodes 41b and 42b, and electrodes 43a and 44a are interconnected and constitute nodal point 49. The electrodes 43b and 44b are connected to output node 13. The gates 41c, 42c, 43c and 44c are connected to respective terminals 45, 46, 47 and 48.

The switching circuit 33 includes an N-channel transistor 51 having main electrodes 51a and 51b and a gate 51c and a P-channel transistor 52 having main electrodes 52a and 52b and a gate 52c. The switching circuit 34 includes an N-channel transistor 53 having main electrodes 53a and 53b and a gate 53c and a P-channel transistor 54 having main electrodes 54a and 54b and a gate 54c. The electrodes 51a and 52a are connected to second input terminal 12. The electrodes 51b and 52b and electrodes 53a and 54a are interconnected and constitute nodal point 59. The electrodes 53b and 54b are connected to second output terminal 14. The gates 51c and 52c, 53c and 54c are connected to respective terminals 55, 56, 57 and 58.

A first capacitor 61 is connected between the first output node 13 and ground. A second capacitor 62 is connected between the second output node 14 and ground. The capacitances of the capacitors 61 and 62 are substantially equal. A third capacitor 63 is connected between nodal point 49 and ground. A fourth capacitor 64 is connected between nodal point 59 and ground. The capacitances of the capacitors 63 and 64 are substantially equal. The capacitance of the third capacitor 63 is comparable to the capacitance of the first capacitor 61. In an integrated circuit version of the circuit, the capacitors 61, 62, 63 and 64 would be at least in part parasitic capacitances. In that case the capacitance of capacitor 61 would correspond to the capacitance of electrodes 21b, 23b, 25b, 43b, 44b and 24c, and associated conductors with respect to ground. The capacitance of capacitor 62 would correspond to the capacitance of electrodes 22b, 24b, 26b, 53b, 54b and 23c and associated conductors with respect to ground. The capacitance of capacitor 63 would correspond to the capacitance of electrodes 43a, 44a, 41b, 42b, and associated conductors with respect to ground. The capacitance of capacitor 64 would correspond to the capacitance of electrodes 53a, 54a, 51b, 52b and associated conductors with respect to ground. The capacitors 61, 62, 63 and 64 could be augmented in value by specifically introduced capacitors, if desired.

A single cycle of operation of the circuit of FIG. 1 will now be described in connection with the waveform diagrams of FIGS. 2A–2E. The clock voltage $\phi_1$ of FIG. 2A is applied to terminal 28. The clock voltage $\phi_2$ of FIG. 2B is applied to terminals 46 and 56. The clock voltage $\bar{\phi}_2$ of FIG. 2C is applied to terminals 45 and 55. The clock voltage $\phi_3$ of FIG. 2D is applied to terminals 47 and 57. The clock voltage $\bar{\phi}_3$ of FIG. 2E is applied to terminals 48 and 58. A voltage $+V_{DD}$ is applied to terminal 15. A first signal voltage $V_1$ is applied to terminal 11 and a second signal voltage $V_2$ is applied to terminal 12. Assume that signal voltage $V_1$ is greater than signal voltage $V_2$.

During a first period of time $t_0$ to $t_1$, the voltage $\phi_1$ applied to the gates 25c and 26c of respective transistors 25 and 26 renders them conductive thereby lowering the first and second output nodes 13 and 14 to substantially the voltage of supply terminal 16. Also, during the period of time, $t_0$ to $t_1$, the clock voltages $\phi_2$ and $\bar{\phi}_2$ applied to the gates of respective transistors 42 and 41 renders them conductive thereby charging capacitor 63 and hence the nodal point 49 to the voltage $V_1$. Also, during the period of time $t_0$ to $t_1$, clock voltages $\phi_2$ and $\bar{\phi}_2$ applied to the gates of respective transistors 56 and 55 renders them conductive thereby charging the capacitor 64 and hence the nodal 59 to the voltage $V_2$.

During a second period of time $t_1$ to $t_2$, the voltages $\phi_2$ and $\bar{\phi}_2$ applied to the gates of respective transistors 42 and 41 render them nonconductive. Also, during the period of time $t_1$ to $t_2$, the voltages $\phi_2$ and $\bar{\phi}_2$ applied to the gates of respective transistors 52 and 51 renders them non-conductive. Charge corresponding to the voltage $V_1$ is stored on capacitor 63 and a charge corresponding to the voltage $V_2$ is stored on capacitor 64. Also, during the period of time $t_1$ to $t_2$, the transistors 43 and 44 are rendered conductive by the application of respective voltages $\phi_3$ and $\bar{\phi}_3$ to the gates thereof thereby enabling the charge stored on capacitor 63 to flow into the capacitor 61. Also, during the period of time $t_1$ to $t_2$, the transistors 53 and 54 are rendered conductive by the application of respective voltages $\phi_3$ and $\bar{\phi}_3$ to the gates thereof thereby enabling the charge stored on capacitor 64 to flow into the capacitor 62. A voltage is produced on node 13 which is greater than the voltage produced on node 14 as the signal voltage $V_1$ is greater than signal voltage $V_2$. With the switches 25 and 26 now open, capacitors 61 and 62 are charged through respective P-channel transistors 21 and 22 functioning as current sources. In the charging operation, as the potential appearing at node 13 and on the gate of transistor 24 is greater than the potential appearing at node 14 and on the gate of transistor 23, transistor 24 is turned on first thereby lowering the potential on node 14 and the gate of transistor 23 and allowing the capacitor 61 and hence the node 13 to be charged rapidly through P-channel transistor 21 to substantially the potential $+V_{DD}$ of supply terminal 15. Feedback from output node 14 to the gate of transistor 23 maintains the transistor 23 in the off condition. Feedback from node 13 to the gate of transistor 24 causes transistor 24 to be rapidly turned on. Thus, the circuit provides an indication that $V_1$ is greater than $V_2$. If $V_1$ were less than $V_2$ output node 14 would have been charged to substantially the potential $+V_{DD}$ and the output node 13 would remain at substantially ground potential.

During a third period of time, $t_2$ to $t_3$, the signal at node 13 is passed through an inverter 66 to a utilization circuit such as a storage circuit 67 where the information may be stored as a bit of a digital word. The signal at node 14 is the complement of the signal at node 13 and may be applied to inverter 69 to obtain a complementary output.

The comparator may be used in a successive approximation analog-to-digital converter. In such an application the voltage $V_1$ would represent a sample of an analog signal and successive values of the voltage $V_2$, such as $\frac{1}{2}V_{DD}, (\frac{1}{2}\pm\frac{1}{4})V_{DD}, (\frac{1}{4}\pm\frac{1}{8})V_{DD}$, etc. would represent successive reference values. Comparison of the voltage $V_1$ and successive values of the voltage $V_2$ would provide successive outputs which are convertable into successive bits of a digital word representing the sample of the analog signal.

While the comparator in accordance with the present invention is shown in schematic circuit form, it will be understood that the circuit can be readily integrated on a monolithic substrate of silicon using CMOS technology in a manner well known to those skilled in the art.

Voltages equal to the supply voltage $V_{DD}$ can be compared as the capacitor 61 connected in parallel with capacitor 63 and the capacitor 62 connected in parallel with capacitor 64 in the operation of the circuit reduces their magnitudes. Capacitor 61 is comparable in magnitude to capacitor 63 and capacitor 62 is comparable in magnitude to capacitor 64. Thus, in an analog-to-digital converter the same power supply can be used for the analog and digital circuits thereof.

The comparator circuit of the present invention is symmetric about the dotted line 68 extending through the circuit, i.e., the portion of the circuit to the right of the line 68 of symmetry is structurally identical to the portion of the circuit to the left of the line of symmetry, for example, transistor 23 is structurally identical to transistor 24, transistor 52 is structurally identical to transistor 42, etc. The high degree of matching that can be achieved in the circuit in integrated form results in a very low offset voltage for the comparator.

Clock voltage feed through to the sensing nodes 49 and 59 is minimized. The series input switches 33 and 34, are designed to be identical in size. Accordingly, the feedthrough capacitances of the N-channel transistors will match each other and the feedthrough capacitances of the P-channel transistors will match each other. Since the transistors of like channel type connected in series are clocked by opposite polarity voltages $\bar{\phi}_2$ and $Q_3$ (or $Q_2$ and $\bar{\phi}_3$) the feedthrough of clock voltages to nodes 49 and 59 is automatically compensated.

The comparator circuit has high sensitivity as a small difference in the voltages $V_1$ and $V_2$ produces a large change in voltage on the output nodes 13 and 14 due to the self-latching action of the circuit comprising transistors 21, 22, 23 and 24.

The input impedance at each of the inputs of the comparator is high as the switches 31 and 32 at one input are not on at the same time and also as switches 33 and 34 at the other input are not on at the same time.

The comparator switching speed can be very fast as it is dependent on the small capacitances 61 and 62 at nodes 13 and 14 and the time constants of their charging circuits.

While the latch circuit of the comparator included P-channel transistors 21 and 22, a depletion mode N-channel transistor with gate connected to source could be substituted for each of these transistors, if desired.

While the invention has been described in a specific embodiment, it will be understood that modifications may be made by those skilled in the art and it is intended by the appended claims to cover all such modifications and changes as fall within the true spirit and scope of the invention.

What is claimed is:
1. A voltage comparator:
 a first and a second voltage supply terminal,
 a first and a second output node,
 a first and a second current source,
 said first current source connected between said first voltage supply terminal and said first output node,
 said second current source connected between said first voltage supply terminal and said second output node,
 a first capacitor and a second capacitor of substantially identical capacitance,
 said first capacitor connected between said first output node and said second voltage supply terminal,
 said second capacitor connected between said second output node and said second voltage supply terminal,
 a first and a second insulated-gate field-effect transistor of one channel conductivity type and of substantially identical structure,
 the channel of said first insulated-gate field-effect transistor connected between said first output node and said second voltage supply terminal,
 the channel of said second insulated-gate field-effect transistor connected between said second output node and said second voltage supply terminal,
 the gate of said first insulated-gate field-effect transistor connected to said second output node,
 the gate of said second insulated-gate field-effect transistor connected to said first output node,
 means for applying a first unidirectional voltage between said first and second voltage supply terminals,
 a first switching means for connecting said first output node to said second voltage supply terminal during a first period of time whereby the potential of said first output node is set to substantially the potential of said second voltage supply terminal during said first period of time,
 a second switching means for connecting said second output node to said second voltage supply terminal during said first period of time whereby the potential of said second output node is set to substantially the potential of said second voltage supply terminal during said first period of time,
 a third capacitor and a fourth capacitor of substantially identical capacitance, the capacitance of said third capacitor being comparable to the capacitance of said first capacitor,
 means for providing a first signal voltage,
 means for providing a second signal voltage less than said first signal voltage,
 a third switching means for charging said third capacitor to said first signal voltage during said first period of time,
 a fourth switching means for charging said fourth capacitor to said second signal voltage during said first period of time,
 a fifth switching means for connecting said third capacitor in parallel with said first capacitor at the end of said first period of time,
 a sixth switching means for connecting said fourth capacitor in parallel with said second capacitor at the end of said first period of time,
 whereby at the end of said first period of time the first and second capacitors and hence the gates of said first and second transistors are charged through said first current source and said second current source causing said second transistor to become conductive as the gate thereof has a greater initial voltage appearing thereon than the gate of said first transistor and causing said first transistor to remain nonconductive as the voltage on said second out- put node is fed back to the gate of said first transistor.

2. The voltage comparator of claim 1 in which said first current source is a third insulated gate field effect transistor of opposite channel conductivity type, the channel of said third field effect transistor being connected between said first voltage supply terminal and said first output node, in which said second current source is a fourth field effect transistor of opposite channel conductivity type, the channel of said fourth field effect transistor being connected between said first voltage supply terminal and said second output node, and in which the gates of said third and fourth transistors are biased at a potential to render the channels thereof conductive.

3. The voltage comparator of claim 1 in which said first insulated-gate field-effect transistor and said second insulated-gate field-effect transistor are N-channel transistors.

4. The voltage comparator of claim 2 in which said first insulated-gate field-effect transitor and said second insulated-gate field-effect transitor are N-channel transistors and in which said third insulated-gate field-effect transistor and said fourth insulated-gate field-effect transistor are P-channel transistors.

5. The voltage comparator of claim 2 in which said first switching means includes a fifth insulated gate field-effect transistor of said one channel conductivity type having the channel thereof connected in parallel with the channel of said first insulated gate field effect transistor, and in which said second switching means includes a sixth insulated gate field effect transistor of said one channel conductivity type having the channel thereof connected in parallel with the channel of said second insulated gate field effect transistor.

6. The voltage comparator of claim 5 in which said third switching means includes a seventh insulated-gate field-effect transistor of said one channel conductivity type and an eighth insulated-gate field-effect transistor of said opposite channel conductivity type with their channel regions connected in parallel, in which said fourth switching means includes a ninth insulated-gate field-effect transistor of said one channel conductivity type and a tenth insulated-gate field-effect transistor of said opposite channel conductivity type with their channel regions connected in parallel, in which said fifth switching means includes an eleventh insulated-gate field-effect transistor of said one channel conductivity type and a twelfth insulated-gate field-effect transistor of said opposite channel conductivity type with their channel regions connected in parallel, in which said sixth switching means includes a thirteenth insulated-gate field-effect transistor of said one channel conductivity type and a fourteenth insulated-gate field-effect transistor of said opposite channel conductivity type with their channel regions connected in parallel.

7. The voltage comparator of claim 6 in which said first transistor is structurally identical to said second transistor, in which said third transistor is structurally identical to said fourth transistor, in which said fifth transistor is structurally identical to said sixth transistor, in which said seventh transistor is structurally identical to said ninth transistor, in which said eighth transistor is structurally identical to said tenth transistor, in which said eleventh transistor is structurally identical to said thirteenth transistor, in which said twelfth transistor is structurally identical to said fourteenth transistor.

8. The voltage comparator of claim 6 in which all of said transistors are integrated in a single monolithic substrate of silicon.

* * * * *